United States Patent

[11] 3,615,853

[72] Inventors Thomas O. Paine
Administrator of the National Aeronautics and Space Administration with respect to an invention of;
John V. Goldsmith, Montrose, Calif.; Geza P. Rolik, LaCanada, Calif.

[21] Appl. No. 6,616
[22] Filed Jan. 28, 1970
[45] Patented Oct. 26, 1971

[54] SOLAR CELL PANELS WITH LIGHT-TRANSMITTING PLATE
7 Claims, 3 Drawing Figs.

[52] U.S. Cl. .......... 136/89
[51] Int. Cl. .......... H01l 15/02
[50] Field of Search .......... 136/89

[56] References Cited

UNITED STATES PATENTS

| | | | |
|---|---|---|---|
| 2,904,612 | 9/1959 | Regnier | 136/89 |
| 3,232,795 | 2/1966 | Gillette et al. | 136/89 |
| 3,427,200 | 2/1969 | Lapin et al. | 136/89 |
| 3,510,714 | 5/1970 | Geer | 136/89 X |

*Primary Examiner*—Allen B. Curtis
*Attorneys*—G. T. McCoy, J. H. Warden and Monte F. Mott

ABSTRACT: A solar cell panel with a cover plate which defines a plurality of apertures with light-reflective surfaces. The shapes of the apertures and the spacings between them are chosen to vary the illumination level of the cells as a function of the degree of inclination of the plate with respect to the normal light direction.

JOHN V. GOLDSMITH
GEZA P. ROLIK
*INVENTORS*

*BY*

ATTORNEYS

SOLAR CELL PANELS WITH LIGHT-TRANSMITTING PLATE

ORIGIN OF THE INVENTION

The invention described herein was made in the performance of work under a NASA contract and is subject to the provisions of Section 305 of the National Aeronautics and Space Act of 1958, Public Law 85-568 (72 Stat. 435; 42 USC 2457).

BACKGROUND OF THE INVENTION

Field of the Invention

The present invention generally relates to a cover plate for a light-sensitive structure and, more particularly, to a cover plate for a solar cell panel.

2. Description of the Prior Art

In most space exploration vehicles, solar cell panels are used to convert light from the sun into electricity. For safe operation it is important to keep the temperature of the solar cells within safe operating ranges. This requirement creates problems in missions which carry vehicles away from the earth and nearer to the sun. As the vehicle moves away from the earth toward the sun, the illumination level on the solar cells increases. Unless this illumination level is continuously controlled, the solar cells may experience excessive temperatures which would result in permanent damage.

Attempts to use cover glass plates with reflective coating over the panel's light-sensitive surfaces have been unsuccessful. This is due to the fact that during the initial portions of the mission when the vehicle is near the earth, the reflecting coating prevents the cells from being sufficiently illuminated to provide minimum power requirements. On the other hand, if cover glass plates without reflective coating are used, angles of incidence of the panels, as large as 80° to 85° to the normal, may be required in order to reduce the illumination level to be within safe limits as the vehicle moves toward the sun. Such large angles of incidence are quite undesirable and in some systems may not be feasible. Thus, a need exists for a new approach to continuously control the illumination level on solar cells throughout a space exploration mission from near earth to mear sun.

OBJECTS AND SUMMARY OF THE INVENTION

It is a primary object of the present invention to provide an improved cover plate for a solar cell panel.

Another object of the present invention is to provide a new cover plate for a solar cell panel which is particularly useful in controlling the illumination level of the solar cells to prevent their temperature from exceeding safe values.

These and other objects of the invention are achieved by providing a cover plate for a solar cell panel, which defines a plurality of recesses having inclined sidewalls. The cover plate is made of a material, such as glass, through which light, directed to the solar cells, can pass. The sidewalls of the recesses or apertures are coated with a light-reflecting material, so that the sidewalls act as light reflectors. The shapes and the dimensions of the apertures in the plate are chosen so that when the vehicle, on which the solar cell panel is mounted, is near the earth, the light-sensitive surface of the panel is substantially perpendicular to the light direction, enabling substantially all the light to reach the solar cells. This enables maximum power to be provided at the start of the mission near the earth. However, as the vehicle moves toward the sun, by controllably inclining the panel's light-sensitive surface with respect to the light direction, a substantial portion of the light is reflected back into space by the light-reflecting sides of the apertures. By preventing a controlled part of the light from reaching the solar cells their temperature of operation is controlled to be within safe limits.

The novel features of the invention are set forth with particularity in the appended claims. The invention will best be understood from the following description when read in conjunction with the accompanying drawings.

DESCRIPTION OF THE PREFERRED EMBODIMENTS

Figure 1:
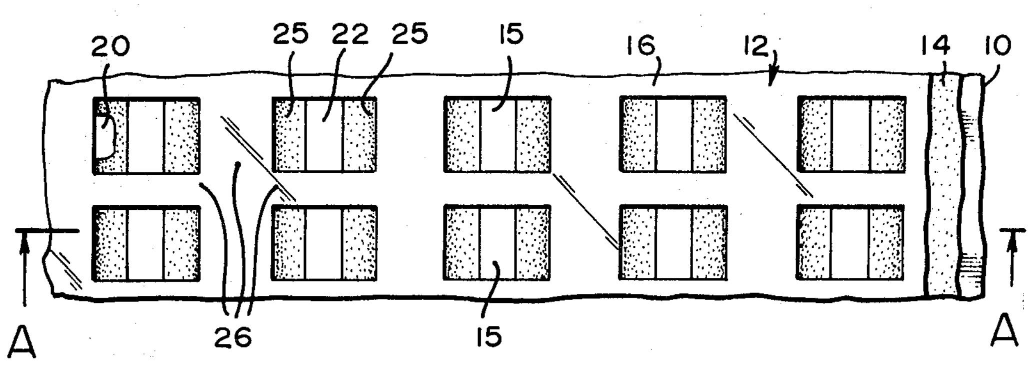
FIG. 1 is a partial top view of a preferred embodiment of the invention.
Figure 2:
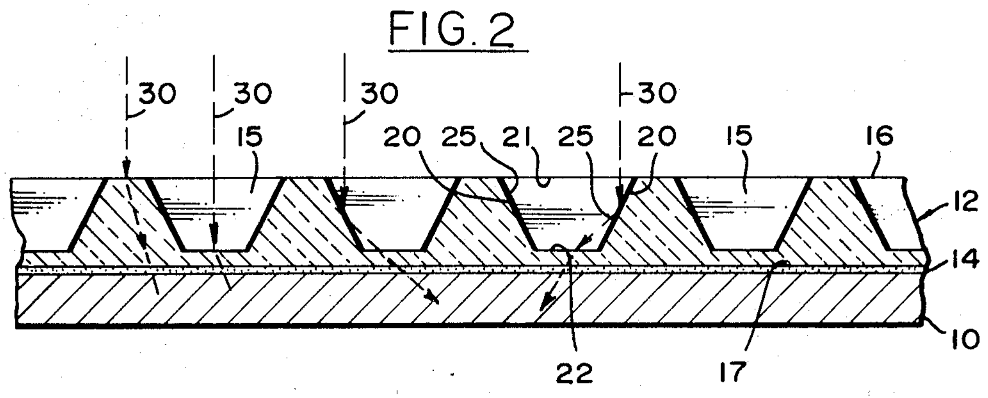
FIG. 2 and 3 are cross-sectional views along lines A—A in FIG. 1.
Figure 3:
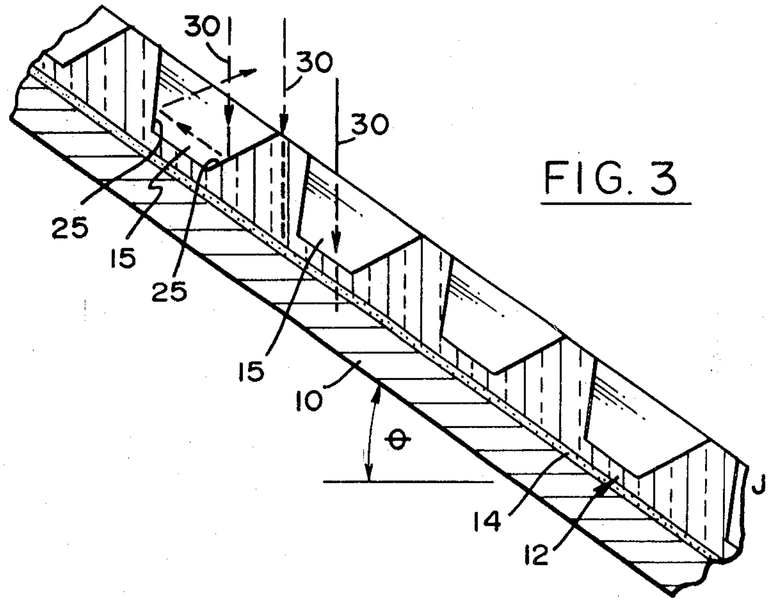

Referring to FIG. 1, therein numeral 10 designates a solar cell panel, assumed to include a plurality of solar cells. A cover plate 12 made of light-transmitting material, such as glass, is affixed to the panel 10 by means of a light-transmitting adhesive or cement 14. Figures 2 and 3 are cross-sectional views taken along lines A—A in FIG. 1.

The glass plate 12 defines a plurality of recesses or apertures 15, each extending from the plate's top side 16 toward the opposite side 17, with the depth of each aperture being less than the thickness of the plate 12. The sidewall of each aperture is designated by numeral 20. Each aperture is shaped so that in a plane in which the plate 12 is canted, as shown in FIG. 3, the aperture in essence has a trapezoidal cross section, defined by a top end 21, a bottom end 22 and two inclining sidewalls 20. The sidewalls 20 of all the apertures are coated by a light-reflective material 25.

The dimensions of each aperture 15, as defined by its depth, the dimensions of the top and bottom ends, 21 and 22, and the spacings 26 between apertures are dependent upon the illumination levels which may be experienced during the mission when the panel may be inclined at different angles with respect to the light direction. As seen in FIG. 2, in which the panel 10 is assumed to be in a plane perpendicular to the direction of light, represented by arrow 30, in the particular embodiment all the light will reach panel 10. Light which strikes the top side 16 of plate 12 between apertures as well as light striking the bottom ends 22 of the various apertures will pass through the plate 12 and reach panel 10. At the same time light striking the reflective material 25 in any aperture will be reflected to the aperture's bottom end 22 and therefrom will pass to the panel 10. Thus, substantially all the light will reach the panel 10. This is desirable since at the start of a mission the panel is generally in a plane perpendicular to the sun direction so that a maximum illumination level is provided to insure that the cells provide sufficient power.

However, as seen from FIG. 3, when the same assembly is inclined by an angle $\theta$ with respect to the normal to the light direction, where $\theta$ is generally less than 45° an orientation which is easily achieved during the mission as the vehicle moves toward the sun, light which strikes the reflective material 25 on aperture sides 20 is reflected back into space. Thus, it is prevented from reaching the solar cells of the panel. In the particular example only light which strikes the plate's top end 16 between apertures and the bottom ends 22 of the apertures 15 passes through the plate to the panel's solar cells, thus, the amount of light which reaches the cells is controlled, thereby controlling their illumination level which affects their operating temperature.

Based on foregoing description, the invention may be summarized as comprising a cover plate which defines apertures with light-reflective sidewalls. The dimensions of the apertures and the spaces there between are selected to vary the illumination of solar cells by light passing through the plate as a function of the degree of inclination of the plate with respect to the normal light direction. In the preferred embodiment each aperture has a trapezoidal cross section, in the plane of panel inclination, so that each aperture has two opposite inclining sides which diverge towards one another from the apertures' top end to the bottom end 22. The depth of each aperture is less than the plate's total thickness. The inclining sides of the apertures are coated with a light-reflective material. As a result, light which strikes these inclining sides is either reflected toward the bottom ends of the apertures and therefrom passes to the solar cells, or is reflected back into space away from the cells, whether the light striking the apertures' side walls passes to the cells or is prevented from reaching them depends on the apertures' dimensions and the degree of inclination of the plate with respect to the normal light direction.

Although particular embodiments of the invention have been described and illustrated herein, it is recognized that modifications and variations may readily occur to those skilled in the art and consequently it is intended that the claims be interpreted to cover such modifications and equivalents.

What is claimed is:

1. A panel of solar cells and a plate of a material which transmits light thereto disposed on said solar cell panel, to control the level of illumination of said cell by light directed thereto said plate defining a plurality of apertures extending inwardly from the light-exposed side of said plate toward the side closest to said panel, each aperture having sides which diverge toward one another with increased aperture depth; and light-reflective material coated on the sides of said apertures, whereby the level of illumination of said cells by light directed to said light-exposed surface of said plate is a function of the dimensions of said apertures, the spacings therebetween and the degree of inclination of said plate with respect to the light direction.

2. The arrangement as recited in claim 1 wherein said material is glass.

3. The arrangement as recited in claim 2 wherein each aperture has a trapezoidal cross section in a plane in which said plate is inclined with respect to said light direction, each aperture defining a top end and a bottom end and two opposite sides which diverge toward one another as viewed from the aperture's top end to its bottom end.

4. The arrangement as recited in claim 3 wherein the total depth of each aperture is less than the total thickness of said plate.

5. The arrangement as recited in claim 1 wherein each aperture has a trapezoidal cross section in a plane in which said plate is inclined with respect to said light direction, each aperture defining a top end and a bottom end and two opposite sides which diverge toward one another as viewed from the aperture's top end to its bottom end.

6. The arrangement as recited in claim 5 wherein the total depth of each aperture is less than the total thickness of said plate.

7. The arrangement as recited in claim 6 wherein said material is glass.